(12) United States Patent
Su et al.

(10) Patent No.: US 7,474,239 B2
(45) Date of Patent: Jan. 6, 2009

(54) SELF-CALIBRATING HIGH-SPEED ANALOG-TO-DIGITAL CONVERTER

(75) Inventors: Chau-Chin Su, Hsinchu (TW);
Hung-Wen Lu, Hsinchu (TW);
Shun-Min Chi, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/774,752

(22) Filed: Jul. 9, 2007

(65) Prior Publication Data

US 2008/0180289 A1 Jul. 31, 2008

(30) Foreign Application Priority Data

Jan. 30, 2007 (TW) .............................. 96103403 A

(51) Int. Cl.
*H03M 1/06* (2006.01)

(52) U.S. Cl. ....................... 341/120; 341/155; 341/119

(58) Field of Classification Search ................. 341/155, 341/141, 160, 143, 120, 119
See application file for complete search history.

(56) References Cited

U.S. PATENT DOCUMENTS

| | | | |
|---|---|---|---|
| 4,211,999 A * | 7/1980 | Clark et al. ................. 341/160 |
| 4,763,106 A * | 8/1988 | Gulczynski ................. 341/141 |
| 6,232,908 B1 * | 5/2001 | Nakaigawa ................. 341/160 |
| 6,320,529 B1 * | 11/2001 | Yasuda ....................... 341/155 |
| 2005/0068212 A1 * | 3/2005 | Jensen ........................ 341/143 |

* cited by examiner

*Primary Examiner*—Jean B Jeanglaude
(74) *Attorney, Agent, or Firm*—Rosenberg, Klein & Lee

(57) ABSTRACT

In a precisely self-calibrating high-speed analog to digital converter the aspect ratios of tri-state inverters are adjusted to fine-tune threshold voltage as comparators. And the multiplexers composed of tri-state inverters amplify the signal from the output of comparators. Their switches of tri-state inverters may be properly controlled to select the optimal channels and reduce unnecessary power consumption. The calibration circuitry utilizes under-sampling to calculate the duty cycles of comparators, selecting the optimal comparators and channels. By the way, the invention may avoid process variation.

28 Claims, 16 Drawing Sheets

SELF-CALIBRATING HIGH-SPEED ANALOG-TO-DIGITAL CONVERTER

BACKGROUND OF THE INVENTION

1. Field of the Invention

The present invention generally relates to a high-speed analog-to-digital converter, and more particularly relates to a precise self-calibrating, low power and high-speed analog-to-digital converter, which may be utilized for high speed wire/wireless receivers, or testing and measurement systems.

2. Description of the Prior Art

Advance in process technology coupled with aggressive circuit design, has led to an explosive growth in speed and circuits integration complexity. For these improvements, to enhance overall system performance, the communication speed between systems and integrated circuits must increase accordingly. As the demand of mass transmission increases, it has become an inevitable trend to transmit at higher data rate in finite channels. Naturally, the importance of high-speed link technology is on the rise.

Today, the analog-to-digital (hereinafter ADC) is build in various consumer products, especially to those transforming the analog signals to digital signals and sending data to the processor for computing information, including wireless device, cell phone, handheld personnel devices etc. Usually in normal working situation the ADC consumes the power proportionally, so in the power-by-batteries handheld electronic devices the power consumption in each component must be considered carefully.

ADCs come in several basic architectures, and many variations exist for each type. Each type has advantages and disadvantages with a particular combination of speed, accuracy, and power consumption. They all fit into a particular application. For example, a digital oscilloscope needs high digitizing speeds but may sacrifice resolution, so it uses flash converters. Some communication devices use pipeline ADCs, which provide better solution than flash converters, but at the expense of speed. General data-acquisition equipments usually adopt successive approximation registers. And audio coders use sigma-delta converters for high resolution.

The conventional flash architecture is the simplest and fastest analog-to-digital converter. In a typical flash ADC, the analog input signal is simultaneously compared to reference voltages by a string of comparator circuits. As the input voltage increases, the comparators set their outputs to logic 1, starting with the lowest comparator. Think of the flash converters as being like a mercury thermometer. As temperature increases, the mercury rises. Likewise, as the input voltage rises, comparators referenced to higher voltages set their outputs from 0 to 1. The thermometer code is encoded into binary code. The reference voltages are provided by connecting to a resistor string to generate the monotonic increase of reference voltages of full scale.

The conventional flash ADC is considered to realize the fastest conversion rate but it suffers from not only larger chip size and larger power dissipation, but also lower dynamic performance due to large input capacitance. For an N-bit flash ADC, $2^N-1$ comparators and $2^N$ resistors are required. Flash ADCs are fast, but they have drawbacks. When resolution increases, the amounts of comparators and resistors grow exponentially, and they consume considerable power. As a result, most flash ADC studies have been focused on less than 8-bit resolution.

The U.S. Pat. No. 5,237,326 discloses a flash type ADC for converting analog signals to N-bit digital signals, and it includes $2^N-1$ comparators having different threshold values in a sequential order which perform full parallel-connected comparison. Buffer-amplifiers buffer the outputs of the respective comparators and a priority encoder encodes the outputs of the comparators. Jincheol Yoo, in "A 1-GSPS CMOS Flash A/D Converter for System-on-Chip Application", presents an ultra fast CMOS flash A/D converter design. Although the featured A/D converter is designed in CMOS, the performance is compatible to that of GaAs technology currently available. To achieve high-speed in CMOS, the featured A/D converter utilizes the Threshold Inverter Quantization (TIQ) technique. A 6-bit TIQ based flash A/D converter was designed with the 0.25 µm standard CMOS technology parameter. It operates with sampling rates up to 1 GSPS, dissipates 66.87 mW of power at 2.5 V, and occupies 0.013-mm² area. The proposed A/D converter is suitable for System-on-Chip (SOC) applications in wireless products and other ultra high-speed applications.

SUMMARY OF THE INVENTION

In view of the above problems associated with the related art, it is an object of the present invention to provide a low power and high-speed analog-to-digital converter. The invention utilizes several comparators by means of adjusting the aspect ratio of tri-state inverters to generate different threshold voltages. In this way, the invention can select some proper comparators by duty cycle estimation. Connecting at the end of comparators are tri-state inverter based multiplexers.

It is another object of the present invention to provide a low power and high-speed analog-to-digital converter. They have gain boosting effects. Besides, the diode connected inductive peaking circuit attached to the output of a multiplexer can enhance the performance at high frequency. Additionally, the inactive tri-state inverters can be properly switched off to reduce the power consumption.

It is a further object of the present invention to provide a precisely self-calibrating, low power and high-speed analog-to-digital converter. It outputs square waves with various duty cycle when input signal is passing through the comparator arrays with different threshold voltages. The duty cycle estimation is executed by under-sampling to select the optimal comparators as calibrated channels. The lower the sampling frequency it is, the less power dissipation it has. The calibration circuit makes it highly accurate, and less impacted by process variation.

Accordingly, one embodiment of the present invention is to provide a high-speed analog to digital converter, which includes: a plurality of comparator arrays receiving an input signal, wherein each comparator array outputs a plurality of analog signals; and a plurality of channel-selecting MUXs correspondingly connecting to the comparator arrays and receiving the analog signals, wherein each channel-selecting MUX outputs a digital signal.

In addition, a self-calibrating and high-speed analog to digital converter includes: an analog to digital converter receiving an input signal, wherein the input signal is divided into a plurality of channels, the analog to digital converter including: a plurality of comparator arrays receiving the input signal, each comparator array outputs a digital signal; and a plurality of channel-selecting MUXs correspondingly connecting to the comparator arrays and receiving the digital signals, each channel-selecting MUX outputs a full pulse digital signal; and a calibration circuits coupled to the analog to digital converter, wherein the calibration circuits includes: a duty cycle estimator coupled to the channel-selecting MUXs and sampling each full pulse digital signal to generate a duty cycle value; a channel selecting circuit coupled to the duty cycle estimator and the channel-selecting MUXs and controlling one of the channel-selecting MUXs to match the threshold voltage to the duty cycle value, then continuing until the last channel-selecting MUX's duty cycle value is produced; a level selecting circuit coupled to the duty cycle estimator and the channel selecting circuit, and sequentially matching the duty cycle values for the comparator arrays, an optimal comparator is selected from the comparator arrays; and a calibration controlling circuit coupled to the duty cycle estimator, the channel selecting circuit and the level selecting circuit to control the whole calibration processes.

Furthermore, a self-calibrating and high-speed analog to digital converter includes: an analog to digital converter including: a plurality of comparator arrays receiving an input signal, wherein each comparator array outputs a digital signal; and a plurality of channel-selecting MUXs correspondingly connecting to the comparator arrays and receiving the digital signals, wherein each channel-selecting MUX outputs a full pulse digital signal; and a calibration circuit coupled to the analog to digital converter, wherein the calibration circuits including: a duty cycle estimation circuit coupled to the channel-selecting MUXs and sampling the full pulse digital signal to generate a duty cycle value; a minimum register storing a minimum differential value between a duty cycle value and a reference duty cycle value; an absolute offset operator coupled to the duty cycle estimation circuit and getting an absolute value of subtracting the duty cycle value from the reference duty cycle value; a digital comparator coupled to the absolute offset operator and the minimum register and comparing the absolute value to the minimum differential value, digital comparator stores the closest absolute value in the minimum register which presents the duty cycle of an appropriate comparator; a plurality of channel selecting registers coupled to the channel-selecting MUXs and passing the digital signal through, the channel selecting registers couple to digital comparator and the digital comparator to store the appropriate comparators in each channel-selecting MUXs; a channel selecting counter coupled to the channel selecting registers and the channel-selecting MUXs' controlling input end to select channels, and storing the channel selecting counter's value into the channel select registers when the value of the minimum register is renewed; a level selecting counter coupled to the channel selecting registers and the channel selecting MUXs, the level selecting counter selects the comparator arrays one by one; and calibration controlling circuit coupled to the duty cycle estimation circuit, the channel selecting counter and the level selecting counter to control the whole calibration processes.

In addition, a self-calibrating method for high-speed analog to digital converter includes: receiving a plurality of digital signals from an analog to digital converter, wherein the analog to digital converter has a plurality of comparator arrays, and each the comparator array has a plurality of comparators; sampling the digital signals to obtain a plurality of duty cycle values; obtaining the duty cycle values in each the comparator, and compare the duty cycle values to a reference duty cycle to obtain a optimal comparators in the comparator array; obtaining a plurality of optimal comparators from the comparator arrays; and outputting a plurality of calibrated digital signals.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a low power and high-speed analog to digital converter and its calibration circuit. Especially, a precisely self-calibrating, low power and high-speed analog to digital converter.

Figure 1:
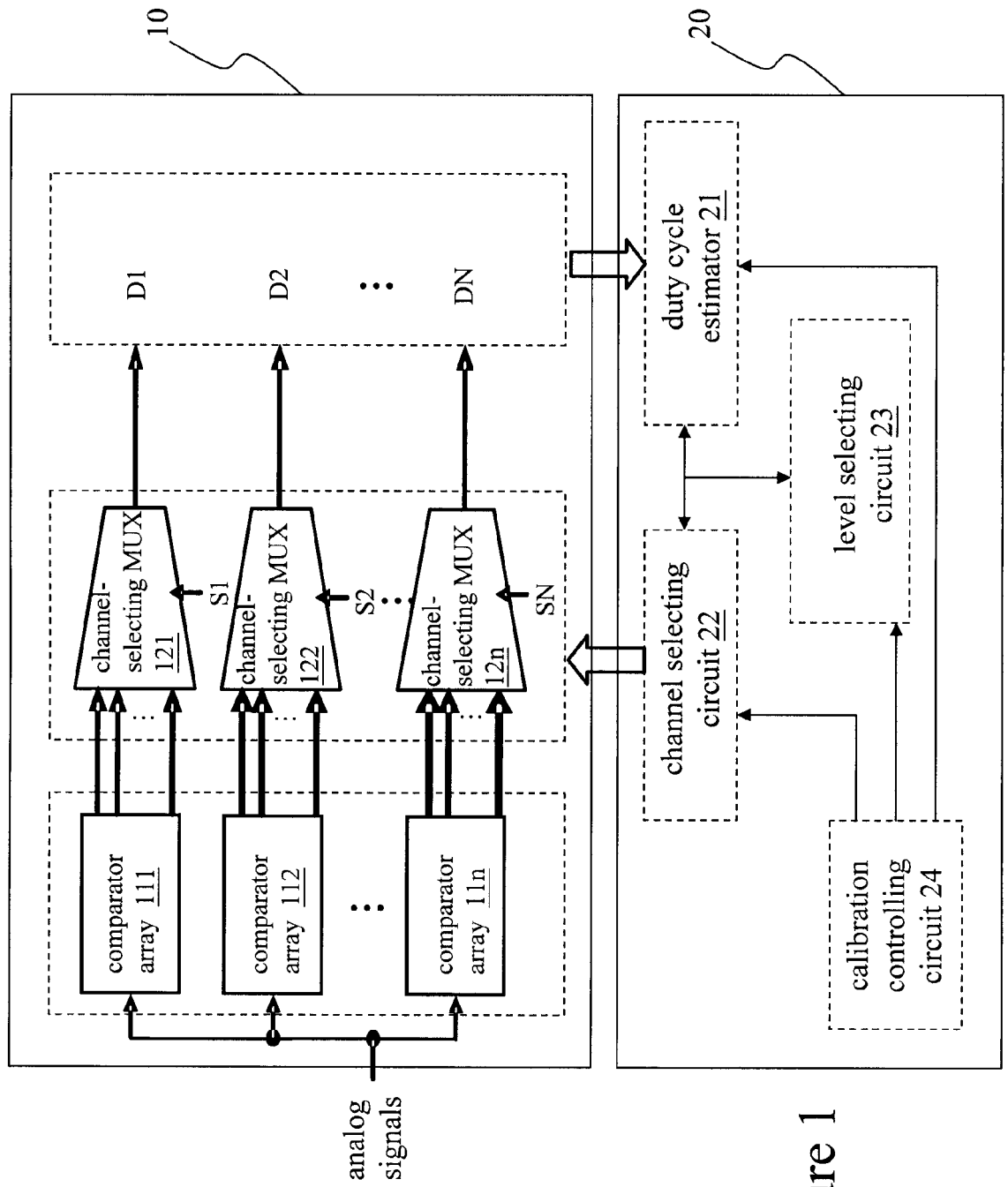
FIG. 1 is a schematic diagram of a high-speed analog to digital converter with its calibration circuit according to one embodiment of the invention.

FIG. 1 shows a schematic diagram of a high-speed analog to digital converter with its calibration circuit according to one embodiment of the invention. The analog to digital converter (hereinafter, ADC) 10 includes several comparator arrays 111, 112 and 11n shunting together and channel-selecting MUXs 121, 122 and 12n correspondingly connecting to each of comparator arrays 111, 112 and 11n to receive the output signals. The ADC 10 receives high-speed analog signals, then each channel-selecting MUXs 121, 122 . . . 12n outputs digital signals from endpoint D1, D2 and DN to a calibration circuit 20.

Figure 2:
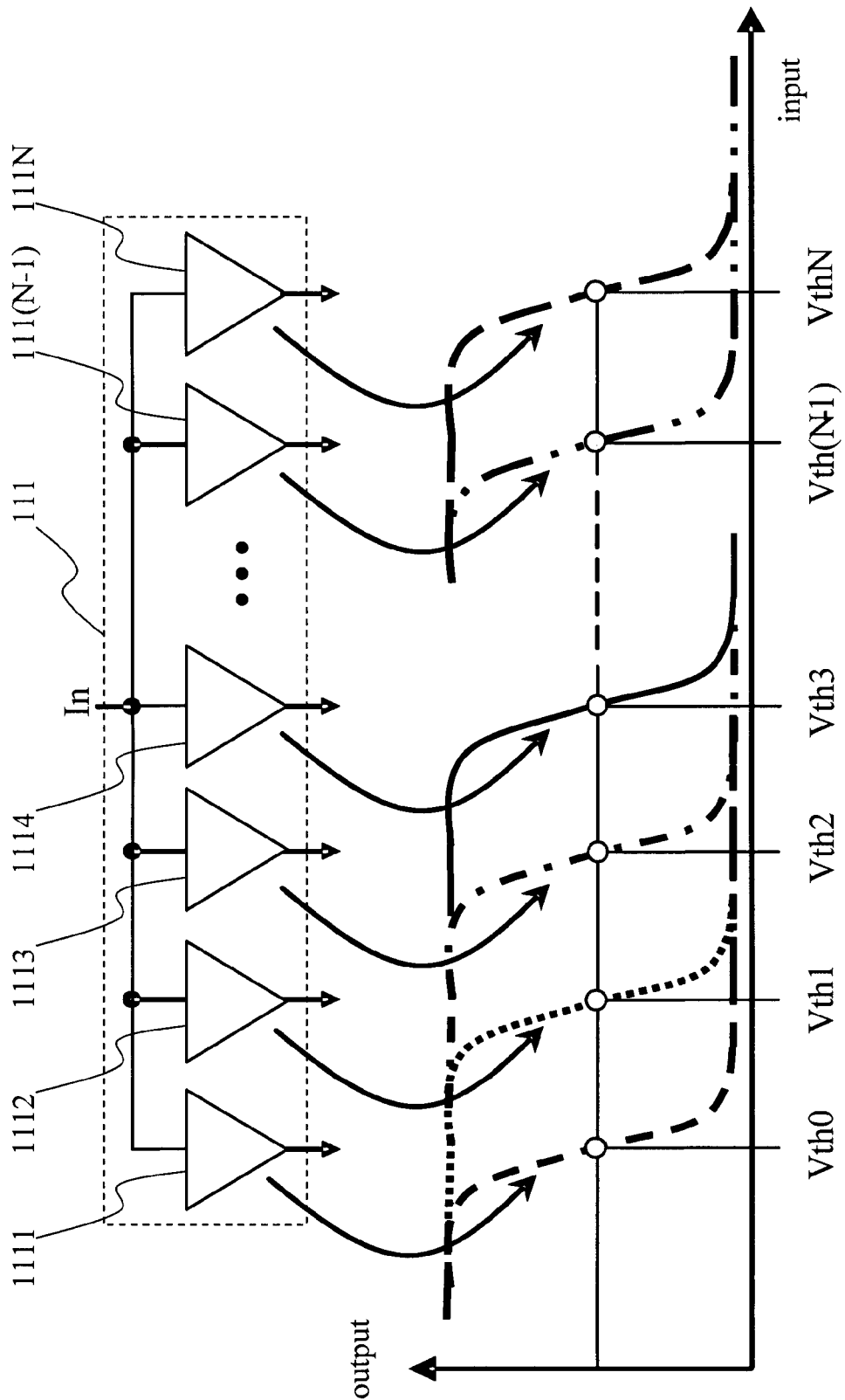
FIG. 2 is a schematic diagram of a comparator array and its voltage transfer curve according to one embodiment of the present invention.

Each of comparator arrays 111, 112 . . . 11n has many comparators shunting together with different threshold voltages, and each comparator is composed of a tri-state inverter (not shown) and an inductive load (not shown). FIG. 2 shows a comparator array and its voltage transfer curve according to one embodiment of the present invention. For example, the comparator array 111 has many comparators 1111, 1112, 1113, 1114 . . . 111(N−1) and 111N shunting together, whose corresponding threshold voltages are Vth0, Vth1, Vth2, Vth3 . . . Vth(N−1) and VthN respectively. Thus comparators 1111, 1112, 1113, 1114 . . . 111(N−1) and 111N output several digital signals presenting a DC bias threshold voltage.

Figure 3B:
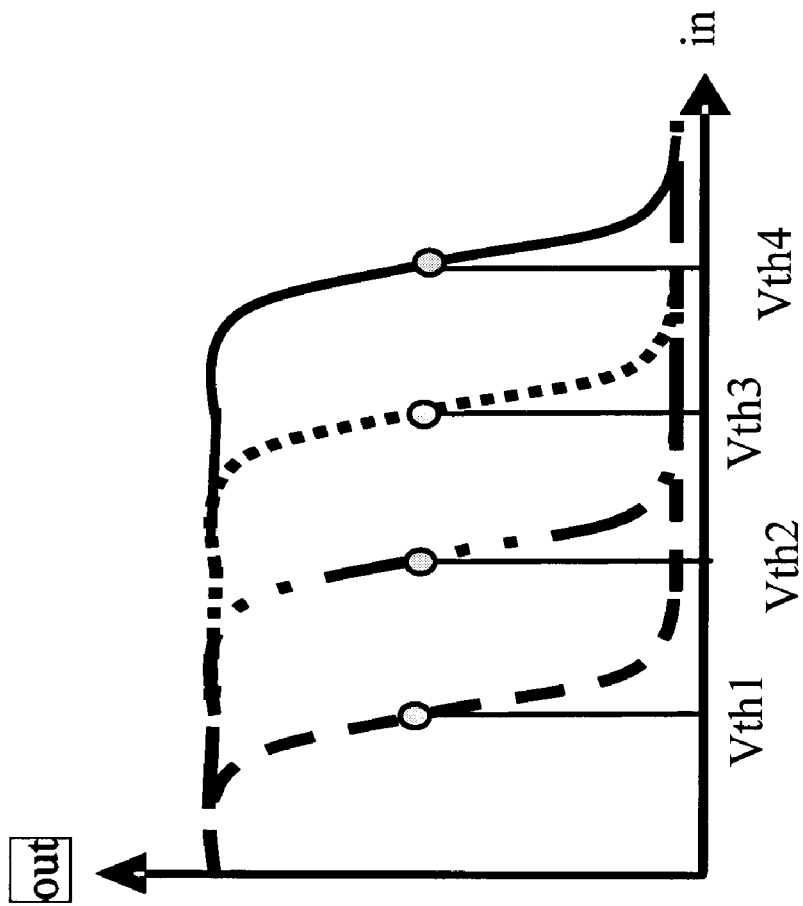
FIG. 3B is a various threshold voltages of the tri-state inverter in FIG. 3A.
Figure 3A:
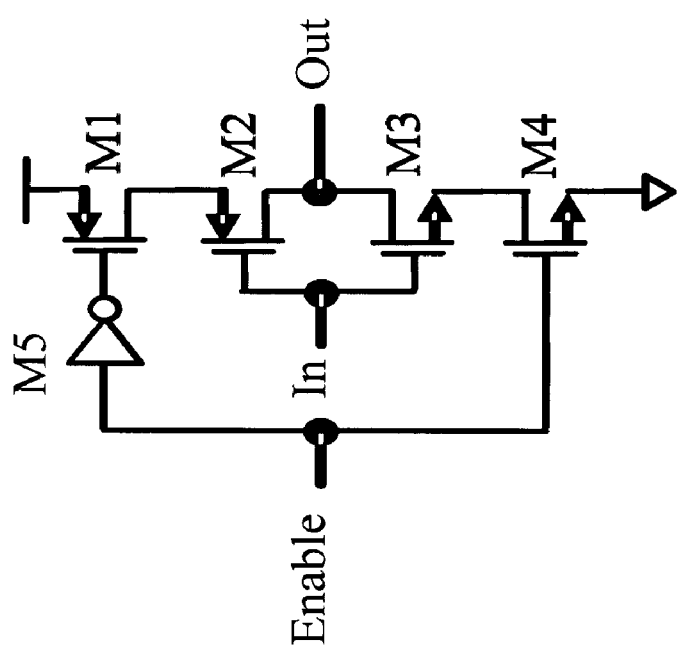
FIG. 3A is a schematic diagram of a tri-state inverter according to one embodiment of the present invention.

In one embodiment the present invention uses tri-state inverters as threshold comparators for the advantages of simple structure, high speed, low power, small area, and controllability. FIG. 3A shows a schematic of the tri-state inverter, which includes: a PMOS M2 coupled to the input In with the gate; a NMOS M3 coupled to the input In with the gate; a PMOS M1 coupled to an inverter's M5 output with the gate; a NMOS M4 coupled to the Enable with the gate; and the inverter M5 connected between the Enable and PMOS M1. Every PMOS and NMOS connects in series with an output Out in the end. By adjusting the aspect ratio of M2/M3 in inverter, the tri-state inverter will have various threshold voltages shown in FIG. 3B. A higher threshold voltage Vth1, Vth2, Vth3 or Vth4 may be acquired by enlarging the width PMOS or shrinking the width of NMOS. In other cases, doing the opposite way may get lower threshold voltage. The various threshold comparators are arranged in parallel and monotonically.

Accordingly, in the comparator array the unnecessary threshold comparators can be switched off to save power. The present invention has greatly improved power consumption. The enabling switches of tri-state inverters are put on the power side and groundside as shown in FIG. 3A. They can be pre-charged and perform better high frequency response. In addition, attaching the inductive peaking circuits (not shown) at the output of comparators sacrifices gain but gets bandwidth to enhance high-speed performance.

Figure 4B:
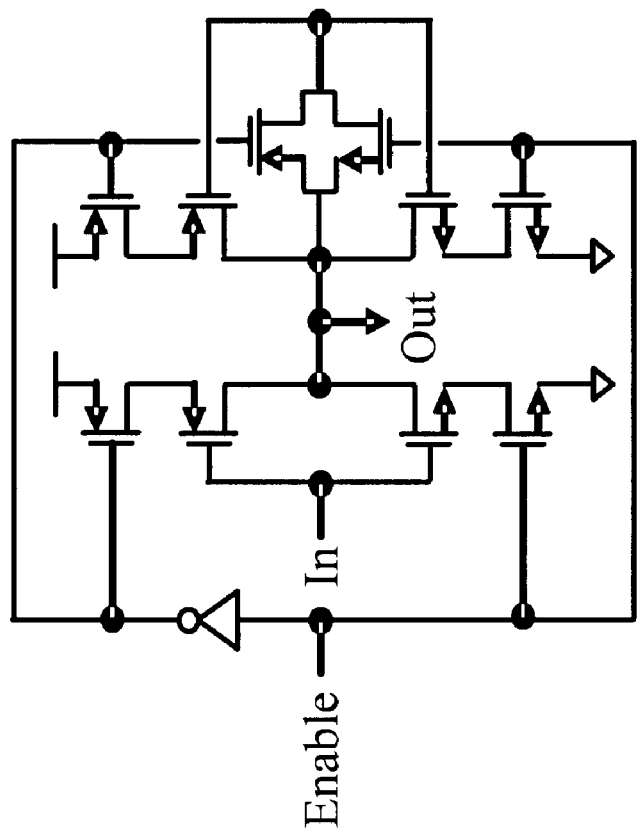
FIG. 4B is a circuit diagram of the threshold comparator in FIG. 4A.
Figure 4A:
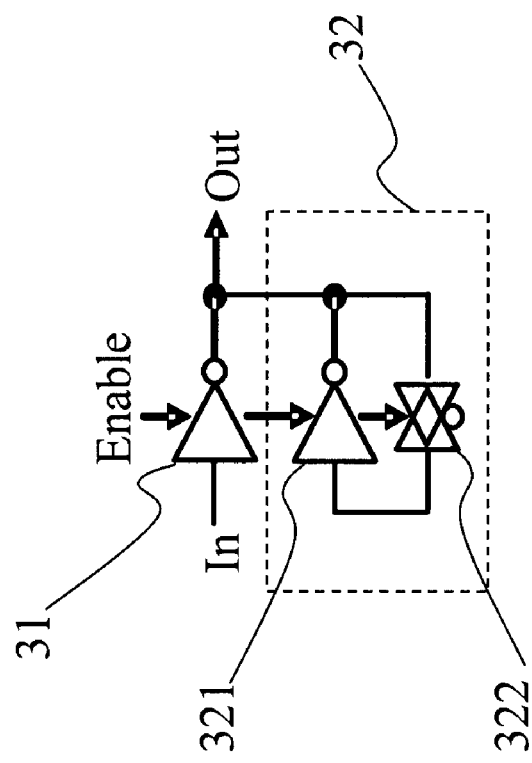
FIG. 4A is a schematic diagram of a threshold comparator according to one embodiment of the present invention.
Figure 5:
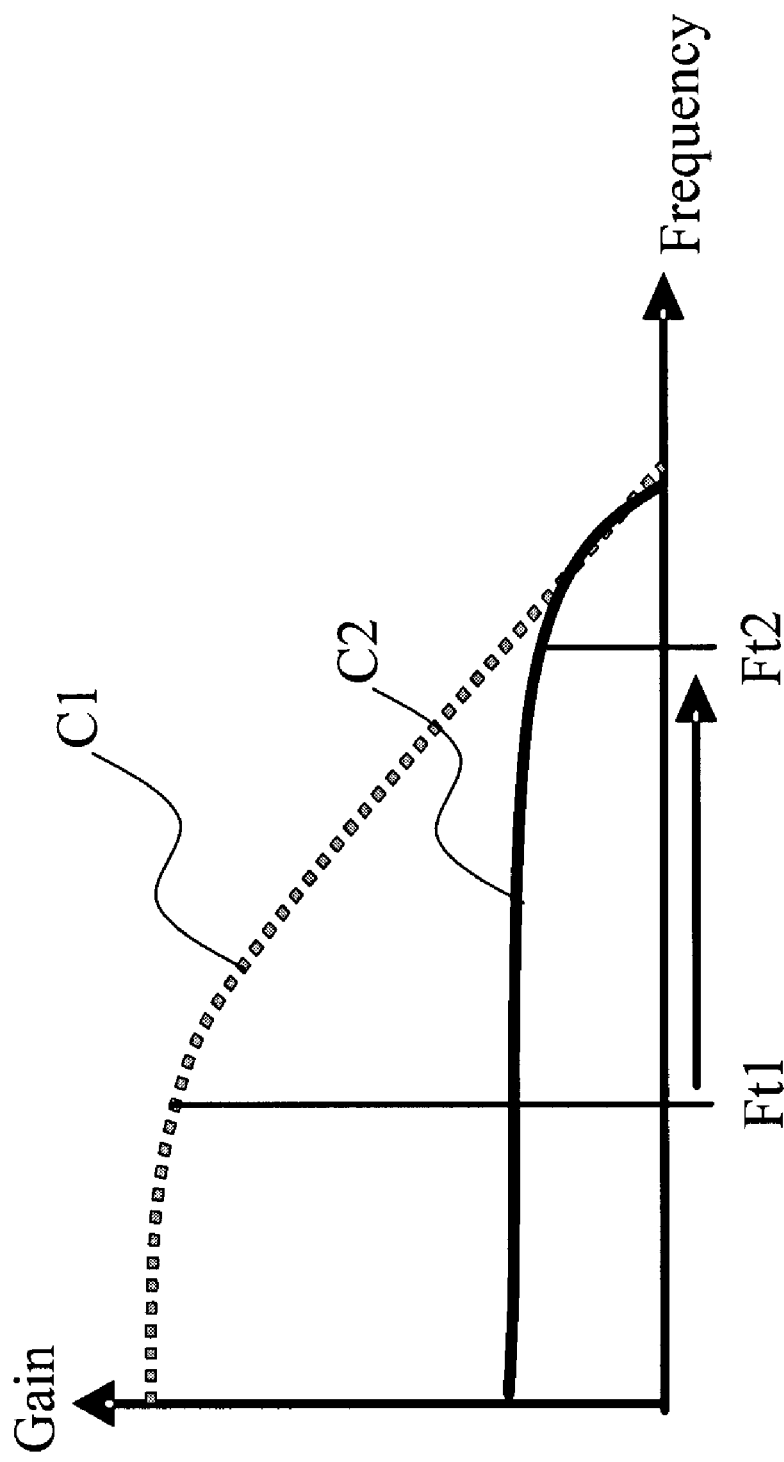
FIG. 5 is a "Gain-Bandwidth Plot" about inductive peaking of the FIG. 4A.

Referring to FIG. 4A, a schematic diagram of a threshold comparator according to one embodiment of the present invention. The threshold comparator includes a tri-state inverter 31 and an inductive load unit 32. The inductive load unit 32 includes an inverter 321 and a transmission gate 322, and it obtains larger gain and extends bandwidth at high frequency and lowers the output resistance of the tri-state inverter, and so does the gain. The FIG. 4B shows the circuit diagram of the threshold comparator in FIG. 4A. And the FIG. 5 is a "Gain-Bandwidth Plot" about inductive peaking of the FIG. 4A. The curve C2 produced in the present invention has lower gain then the curve C2 done by conventional way. Because the tri-state inverter is utilized, the inactive inductive load unit can be properly turned off. The present invention provides a suitable DC current bias threshold voltage.

Figure 6A:
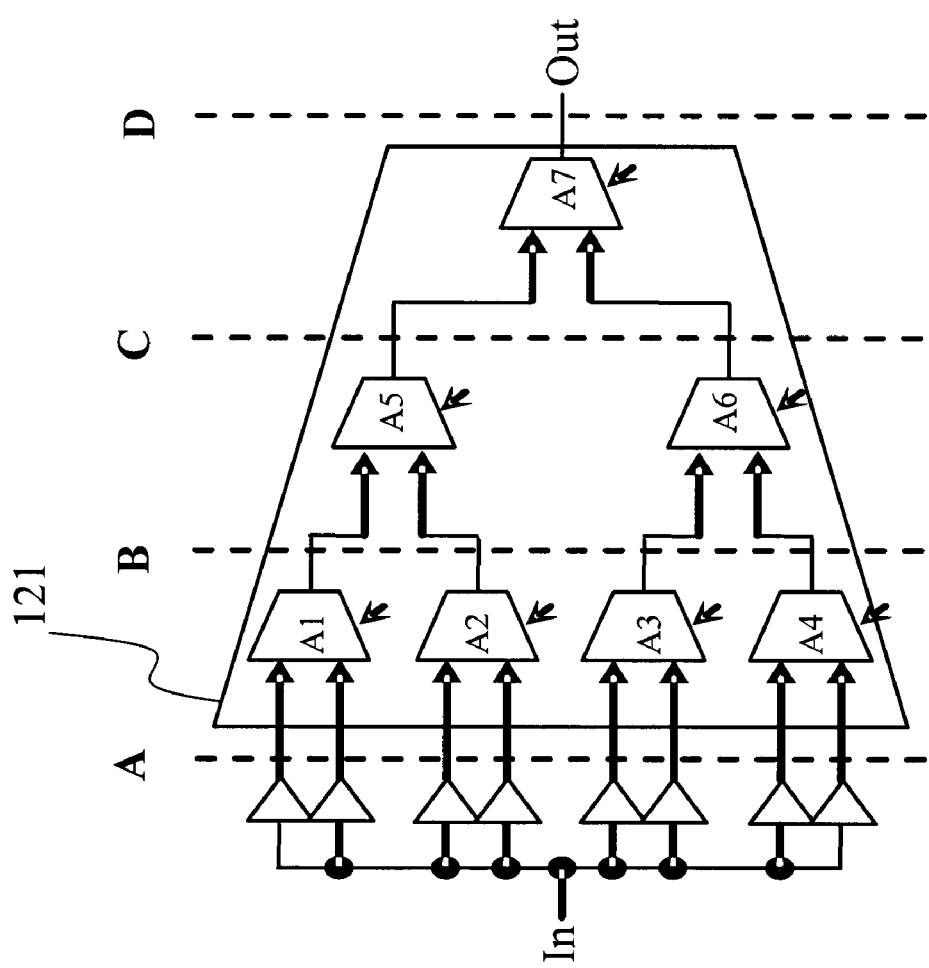
FIG. 6A is a schematic diagram of a 8-to-1 channel selecting MUX according to one embodiment of the present invention.
Figure 6B:
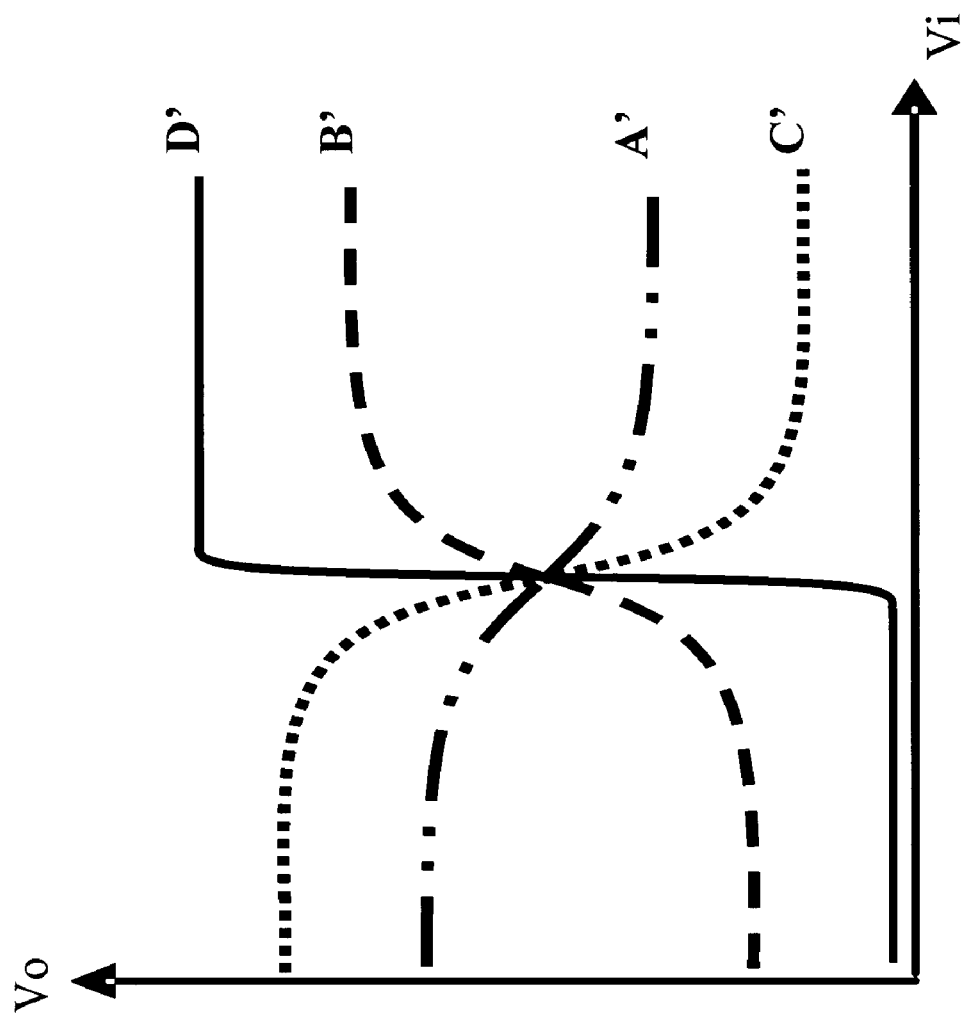
FIG. 6B is the voltage signal cure of the 8-to-1 channel selecting MUX in FIG. 6A.
Figure 6C:
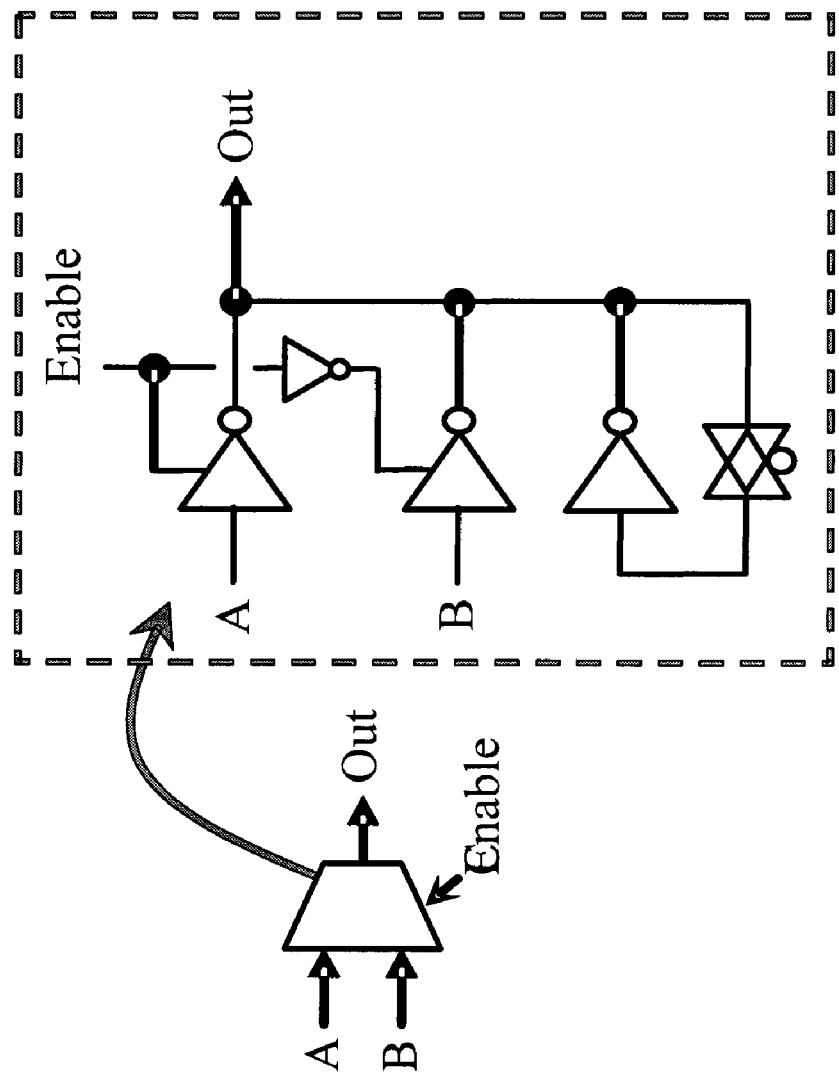
FIG. 6C is a schematic diagram of a 2-to-1 MUX in the 8-to-1 channel selecting MUX in FIG. 6A.

Accordingly, comparator array's outputs connect with the inputs of tri-state inverter based MUX. In FIG. 6A showing a 8-to-1 channel-selecting MUX used in one embodiment of the present invention. There are 7 comparators corresponding to 8 inputs of multiplexers A1, A2, A3, A4, A5, A6 and A7, they are partial overlaps for the sake of small signal coverage and accuracy. The 8-to-1 channel-selecting MUX 121 is composed of tri-state inverters, inductive peaking circuits (or inductive load unit), and control logics. The tri-state inverters work as gain booster, while inductive peaking circuits enhance high-speed characteristics. The channel-selecting MUX 121 allows only one passing path that represents the matching comparators, and the control logics switch off the inactive tri-state inverters to save power The MUX 121 also has gain boosting effects due to cascading tri-state inverters. FIG. 6B shows the voltage signal cure, when signal pass A line the cure is A', signal pass B line the curve is B', signal pass C line the curve is C', and signal pass D line the curve is D'. FIG. 6C shows a 2-to-1 MUX which is composed of several inverters same as threshold comparator. Both have same bandwidth for avoiding the Inter symbol interference (ISI). The present invention connects to the enable switch of inductive peaking tri-state inverter to the enable switch of tri-state inverter in next stage to save power by proper witching operation, In FIG. 1 there are two blocks: the ADC 10 and the calibration circuits 20. The calibration circuits 20 includes: a duty cycle estimator 21 connecting with the output D1, D2, . . . , DN and sampling the digital signals to generate the duty cycle values; a channel selecting circuit 22 connecting with duty cycle estimator 21 and channel selector 121, 122 . . . 12n for controlling a channel selector to match a threshold voltage from related comparator array to a duty cycle value. When all channels are switched for matching the duty cycle value to every comparator array, an optimal comparator is generated. The adjustment of the threshold voltage of comparator array is achieved; a level selecting circuit 23 connecting with duty cycle estimator 21 and channel selecting circuit 22, where the level selecting circuit 23 making the channel selecting circuit 22 doing duty cycle value match one by one for comparator arrays 111, 112 . . . 11n; and a calibration controlling circuit 24 connecting with duty cycle estimator 21, channel selecting circuit 22 and level selecting circuit 23 to control the whole calibration operation.

Furthermore, the calibration circuits 20 has a verifying interface for testing considerations including manual switches for manually selecting channels to test device characteristics and showing the channel, it helps designer to debug.

Figure 7:
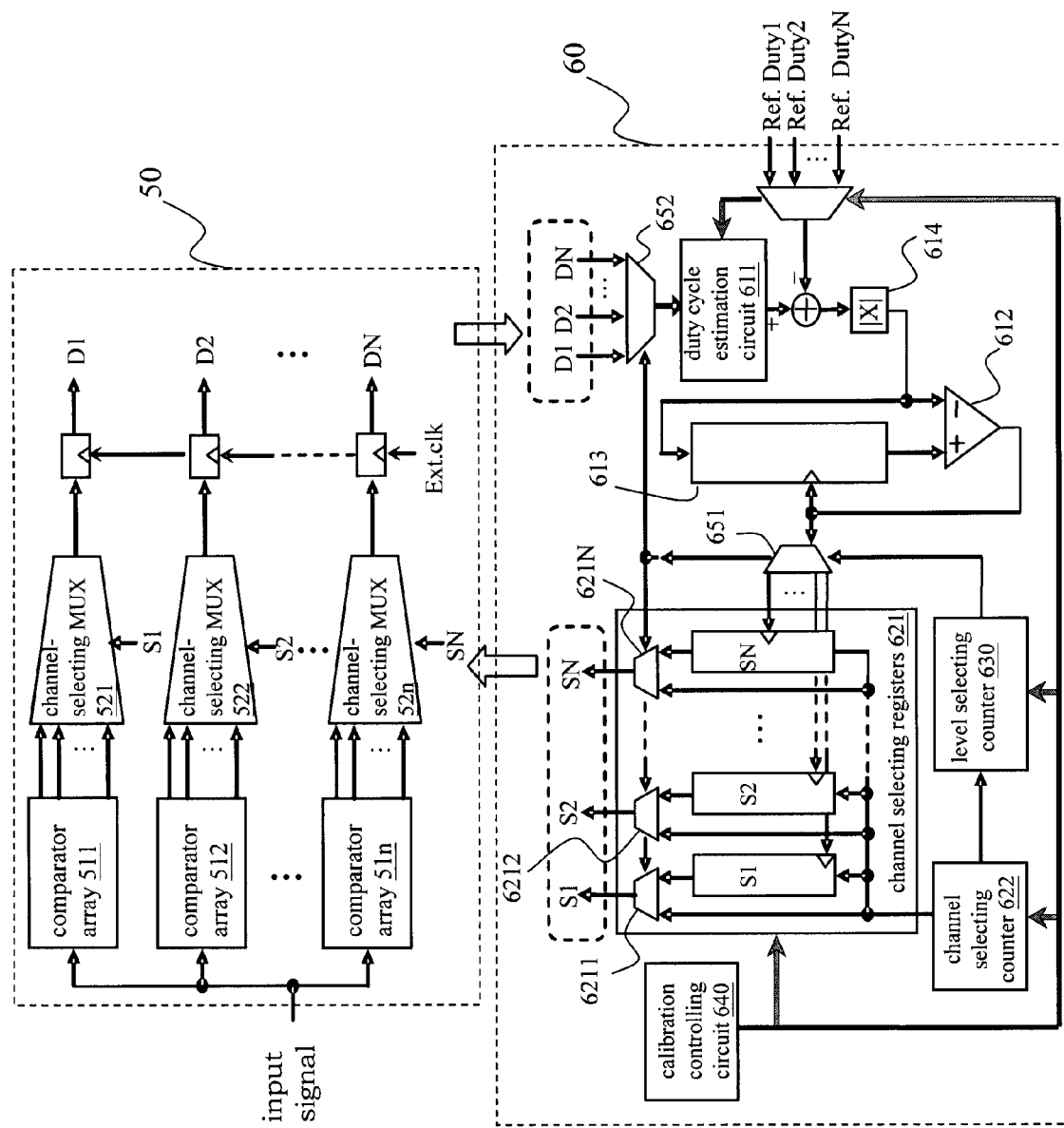
FIG. 7 is a functional diagram of precisely self-calibrating, low power and high-speed analog to digital converter (ADC) according to one embodiment of the present invention.

FIG. 7 shows a precisely self-calibrating, low power and high-speed analog to digital converter (ADC) according to one embodiment of the present invention. The self-calibrating ADC includes an ADC unit 50 and a calibration circuit unit 60. The ADC unit 50 includes: several comparator arrays 511, 512 . . . 51n shunting together and receiving a signal input. Every comparator arrays 511, 512 . . . 51n has many comparators with different threshold voltages shunting together, and each comparator composed of a tri-state inverter and an inductive load (not shown); and channel-selecting MUXs 521, 522 . . . 52n correspondingly connecting each of comparator arrays to receive the output signals. The ADC unit 50 receives high speed analog signals as input signals, then each channel-selecting MUXs outputs a plurality of digital signals from endpoint D1, D2 . . . DN to the calibration circuit unit 60.

The calibration circuit unit 60 couples to the ADC unit 50 and includes: a duty cycle estimation circuit 611, a digital comparator 612, a minimum register 613, an absolute offset operator 614, a channel selecting registers 621, a channel selecting counter 622, a level selecting counter 630 and a calibration controlling circuit 640.

The duty cycle estimation circuit 611 connects to channel-selecting MUXs 521, 522 and 52n and is composed of a stimulus timer and a counter (not shown). The timer is triggered by under-sampling clock, and the counter is utilized to sample full pulse digital signal from channel-selecting MUXs

521, 522 and 52n outputs synchronously. The Duty Cycle estimation circuit 611 can easily calculate the percentage of "one" which is so called "duty cycle" in the counting.

The minimum register 613 is a "parallel in, parallel out" register. It stores a minimum differential value between a duty cycle value and a reference duty cycle value. The absolute offset operator 614 judges which channel is the closet to the reference duty cycle of a channel-selecting MUX. An easy way to find out the best channel is to compare their "distance" to the reference duty cycle. The "distance" here is the absolute difference between sampled number and reference one. So it is a digital comparator 612, which compares the sampled value to the temporary minimum value. When the absolute offset value is less than temporary minimum, the temporary minimum will be updated by new absolute offset value in the minimum register 613.

The duty cycle estimation circuit 611 couples to the channel-selecting MUXs 521, 522 and 52n and samples their full pulse digital signal to generate duty cycle values. The duty cycle estimation circuit 611 evaluates the channels one by one through channel selecting counter 622. The channel selecting registers 621 update the channel numbers when minimum register 613 update occurs. Thus optimal channel numbers are stored in the channel selecting registers 621 after calibration.

The level selecting counter 630 is the same schematic as channel select counter 622 and connects with two multiplexes 651, 652. It makes an increment when the estimation of a channel-selecting MUX is finished. There are fixed number of threshold comparators to be determined through level select counter 622.

The calibration controlling circuit 640 is built in combinational logics. It commands other function blocks to act and being triggered by them for state transition. The state machine tells the status of calibration and it is helpful to debug.

Figure 8:
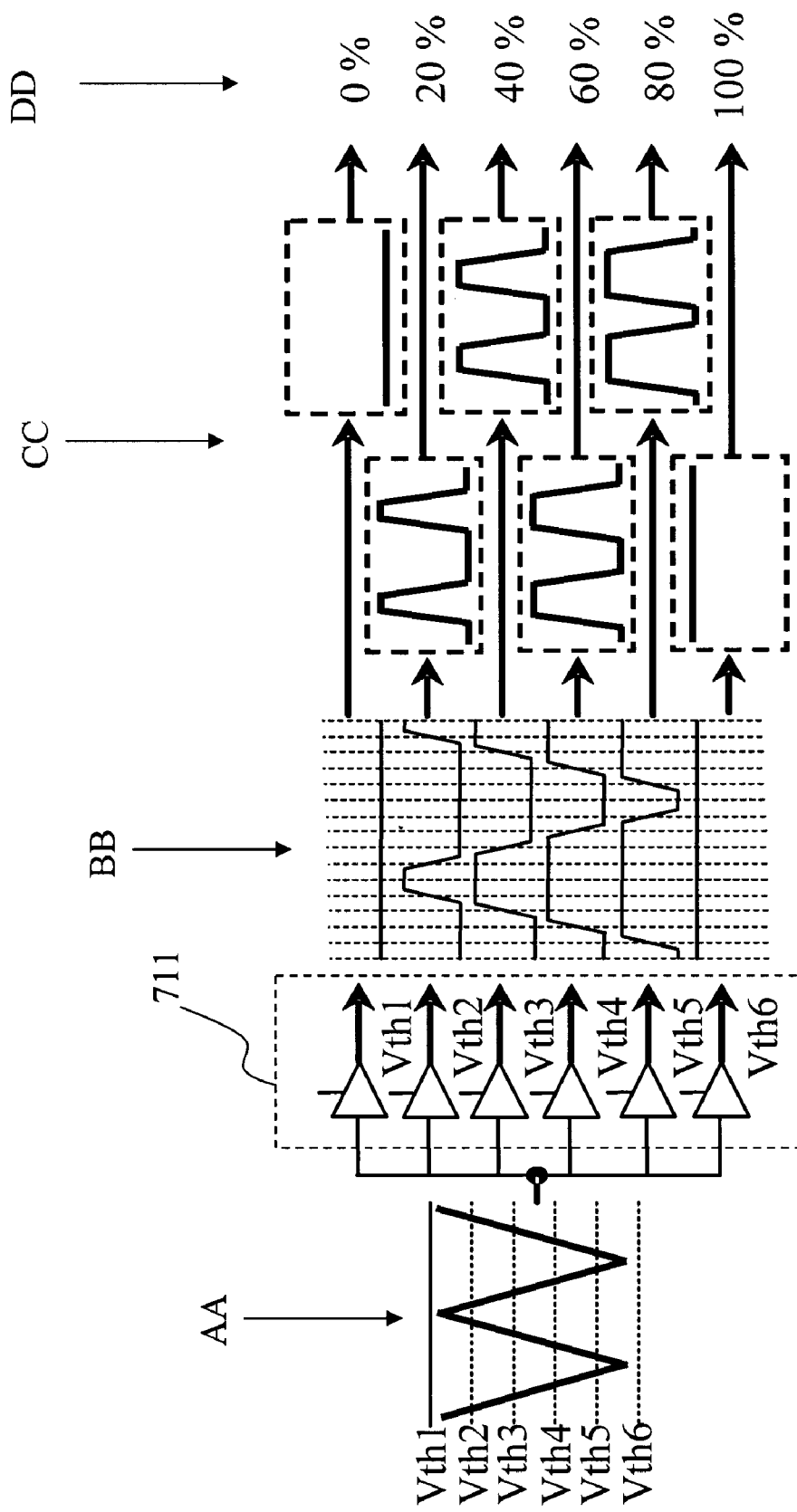
FIG. 8 is a schematic diagram of the duty cycle processes according to one embodiment of the present invention.

The calibration scheme can be realized by threshold voltage modulation. In other words, feeding a periodic signal to comparator arrays of various threshold voltages, it produces digital outputs of various duty cycles. The duty cycle is proportional to the portion of the threshold of input signal as shown in FIG. 8. In AA period the triangle wave with different levels Vth1, Vth2, Vth3, Vth4, Vth5 and Vth6 is input to a comparator array 711, and the output waves are shown in BB period. In CC period the data representing the output waves are shown and are calculated to generate the duty cycle values in DD period. The sampling output means 0%~100%, the proportion of 1 to 0. The present invention randomly strobe the digital outputs to estimate the duty cycle of a channel by under-sampling. After a great deal of counting, the duty cycle of the channel can be obtained precisely. Additionally, the under-sampling has a significant benefit: power dissipation is proportional to clock rate, thus reducing the sampling frequency saves the power.

Figure 9:
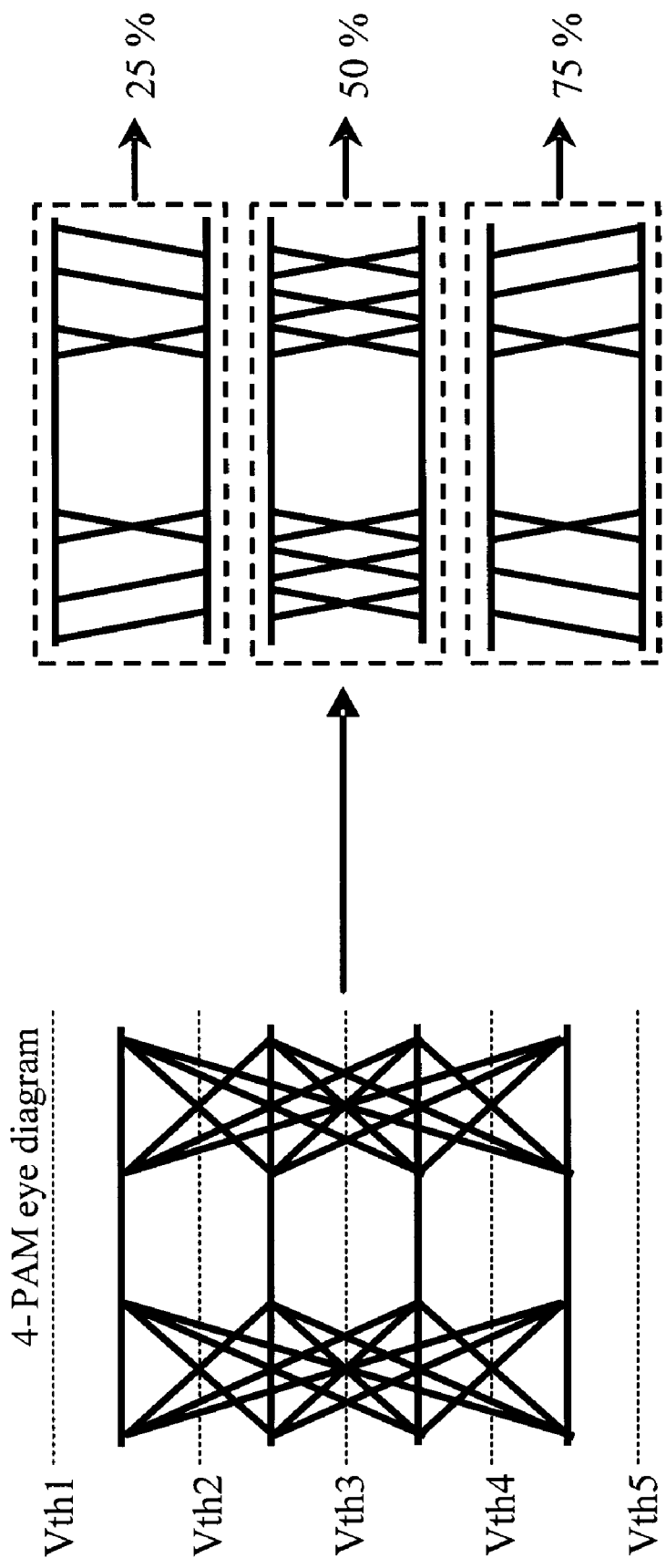
FIG. 9 is a schematic diagram of the duty cycles of comparators according to one embodiment of the present invention.

Example in case of a 4-PAM signal, the center between two levels is the best threshold voltage for conversion. In other words, the three ideal duty cycles of comparators should be 75%, 50%, and 25% shown in FIG. 9.

The calibration flow can be viewed as three loops: small loop for stimulus timer, middle loop for channel select counter, and large loop for level select counter.

Figure 10:
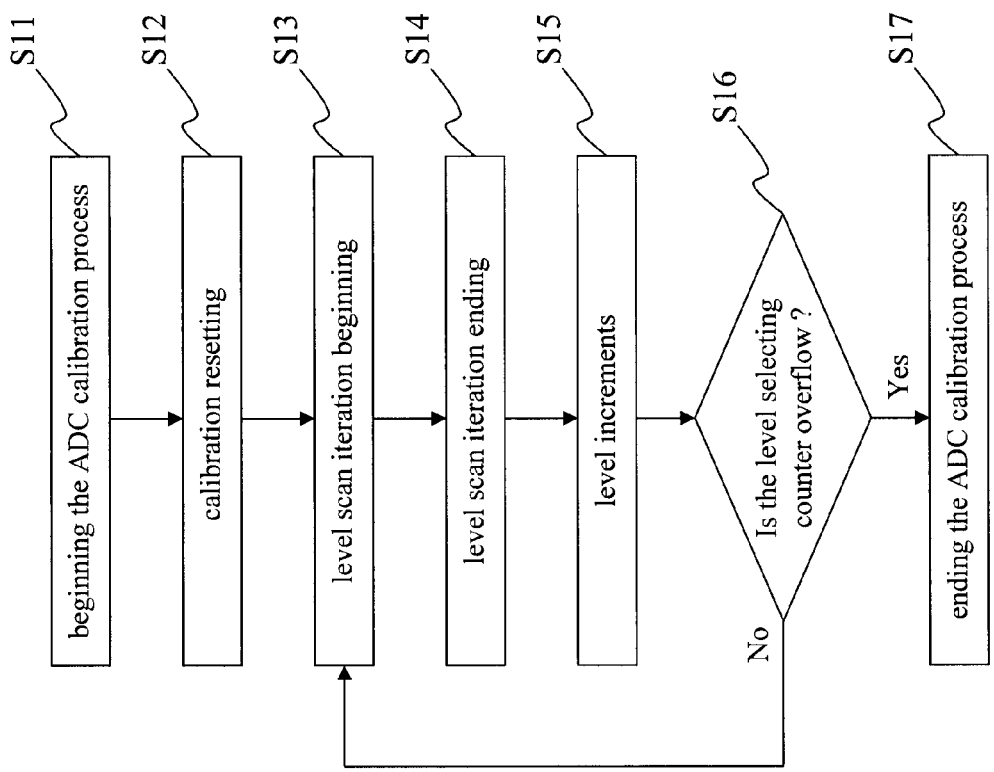
FIG. 10 is a calibration process flow of threshold level according to one embodiment of the present invention.

FIG. 10 shows the calibration process flow of threshold level according to one embodiment of the present invention. Referring FIG. 7 at same time. Step S11 beginning the ADC calibration process, the threshold voltage calibration starts as long as it is switched to calibration mode; Step S12 calibration resetting, the Level selecting counter 630 reset counters and registers; Step S13 level scan iteration beginning, the calibration controlling circuit 640 selects channel-selecting MUXs 521, 522 . . . 52n and comparator arrays 511, 512 . . . 51n sequentially to get duty cycle values for estimation; Step S14 level scan iteration ending; Step S15 level increments, the level selecting counter 630 increments; Step S16 the calibration controlling circuit 640 checking the overflow of level selecting counter 630; if "Yes", it presents all comparator arrays 511, 512 . . . 51n have done the calibration process and should go to the Step S17; if "No", it presents next comparator array should do the level calibration then go to Step S13. Therefore a N-bits ADC needs $2^N-1$ times threshold voltage calibration, for example, a 2 bits ADC has 3 comparator arrays to do the threshold voltage calibration 3 times.

Figure 11:
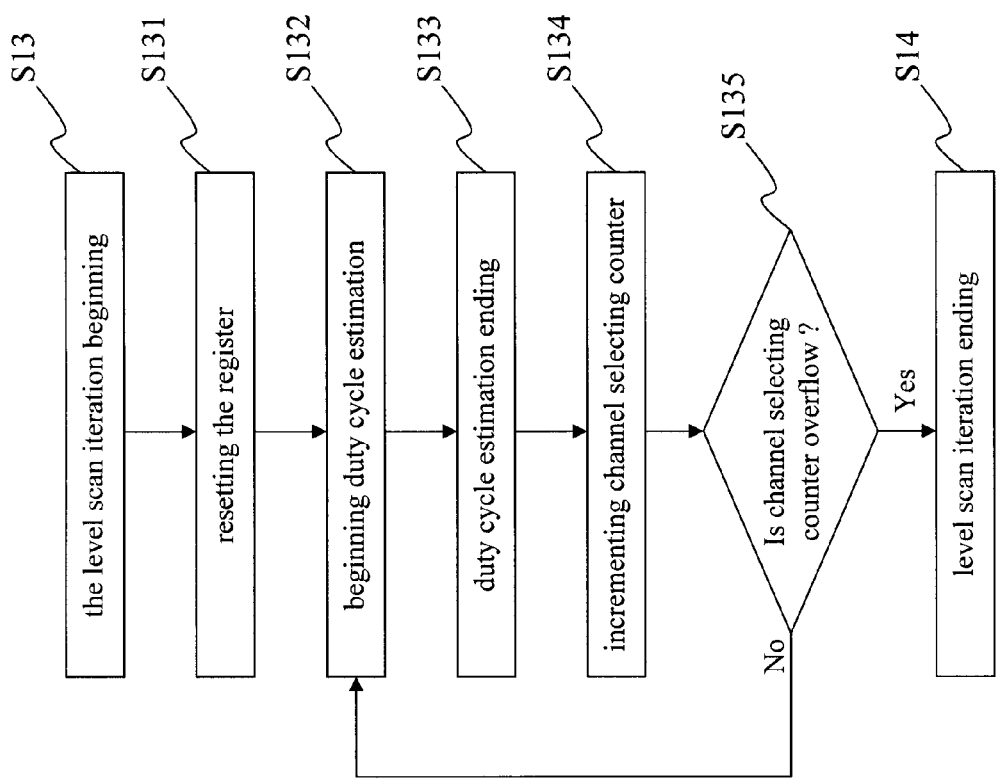
FIG. 11 is a calibration process flow of channel selection according to one embodiment of the present invention.
Figure 11A:
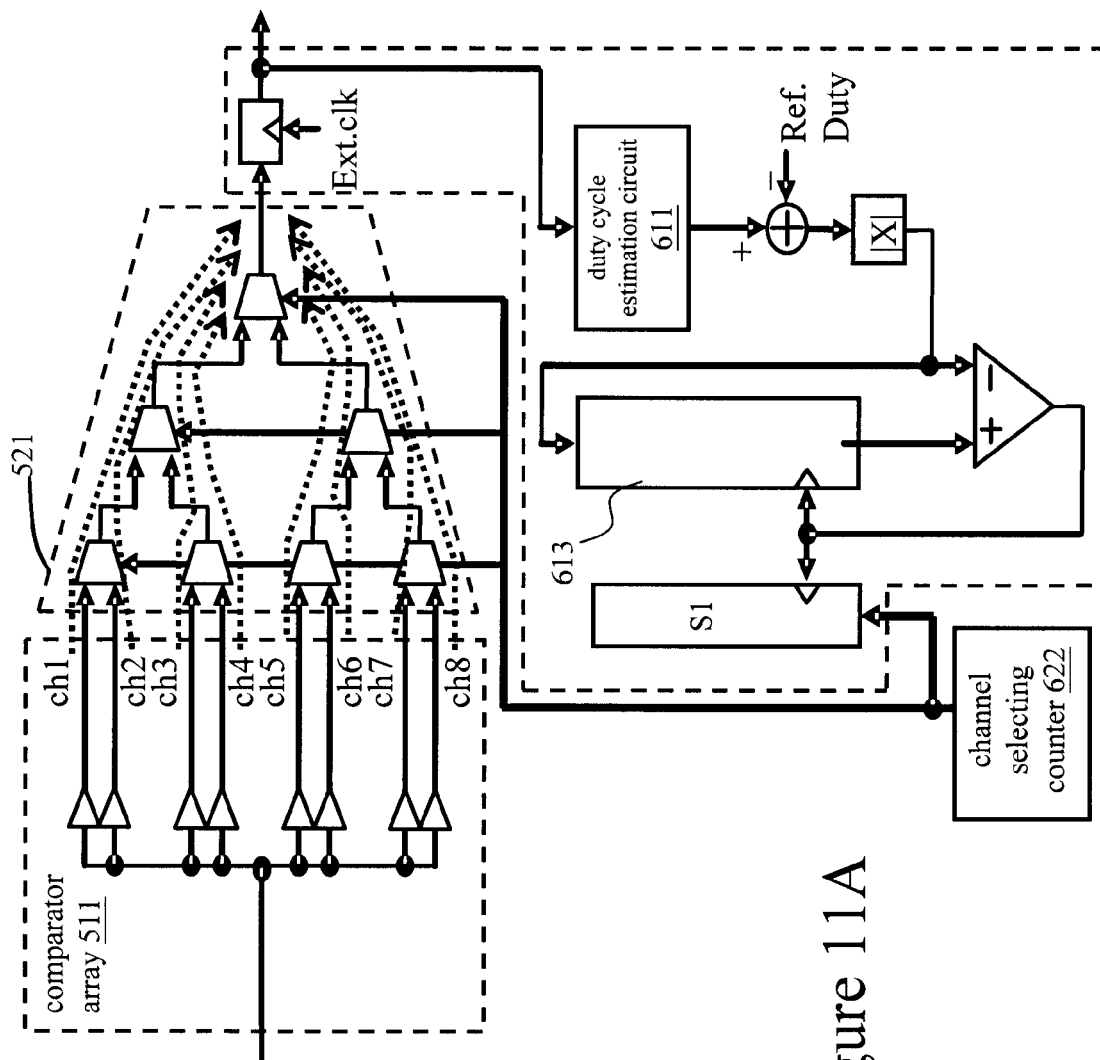
FIG. 11A shows a channel selecting MUX according to one embodiment of the present invention.

The calibration flow as shown in FIG. 11 can be viewed as middle loop for channel select counting in the large loop for level select counting. Step S13 the level scan iteration beginning; Step 131 resetting the register, the calibration controlling circuit 640 resets minimum register 613 and channel selecting registers 621; Step S132 beginning duty cycle estimation asynchronously, in one comparator array the comparators are selected by channel selecting counter 622 and get duty cycle values of comparators for estimation; Step S133 duty cycle estimation ending; Step S134 incrementing channel selecting counter 622; Step S135 the calibration controlling circuit 640 checks the overflow of channel selecting counter 622, if "Yes", it presents all comparators have done the estimation and should go to the Step S14 ending channel evaluation route; if "No", it presents next comparator should do the estimation then go to Step S132. Therefore an 8 channels comparator arrays shown in FIG. 11A shows a channel selecting MUX having several comparators cascading to form channels ch1, ch2, ch3, ch4, ch5, ch6, ch7 and ch8, which are controlled by channel selecting counter 622 for calculating duty cycle value of comparator in the comparator array 511. After comparison, channel selecting counter 622 makes an increment and goes on to next channel counting if it is not the last channel of the channel-selecting MUX 521. If it is, the first channel selecting register stores the optimal channel number of the channel selecting MUX 521.

Figure 12:
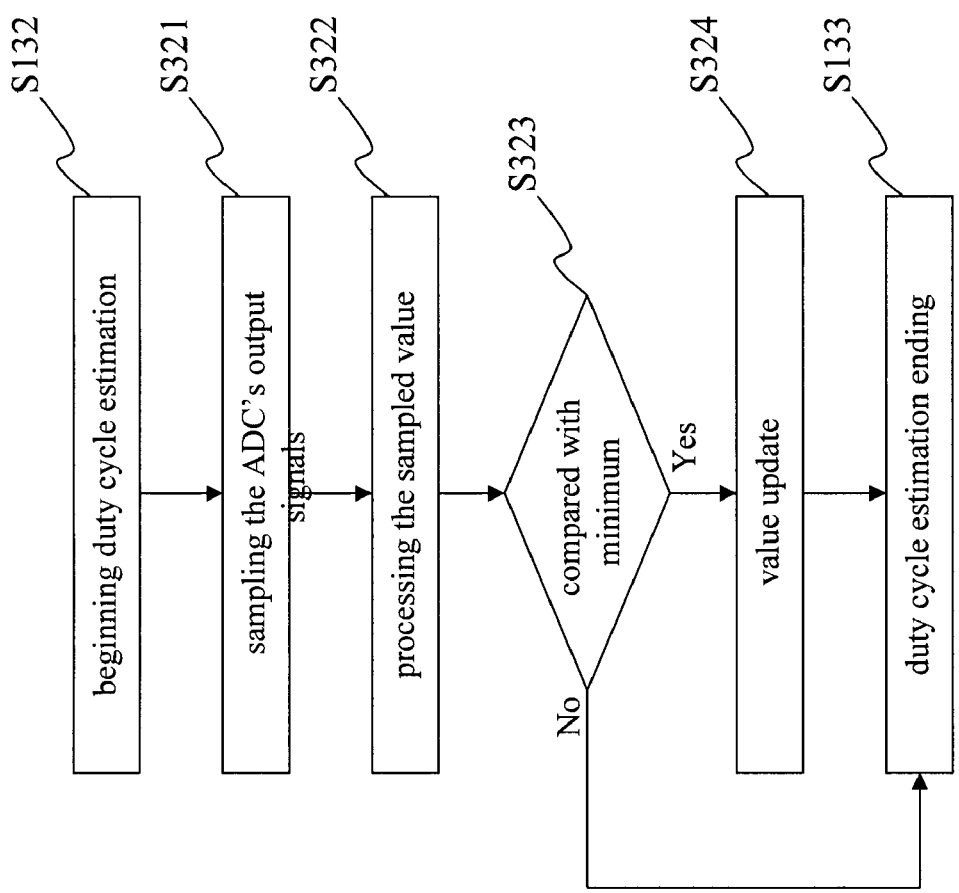
FIG. 12 is a calibration process flow of duty cycle estimation according to one embodiment of the present invention.

The calibration flow as shown in FIG. 12 can be viewed as small loop for stimulus timer in middle loop for channel select counting. Step S132 beginning duty cycle estimation; Step S321 sampling the ADC's output signals, Stimulus timer starts to count and one's counter samples from ADC output during this period; Step S322 processing the sampled value. When time is up, the sampled value is processed through absolute offset operator; Step S323 compared with minimum; Step S324 The minimum register 613 and channel selecting registers 621 are updated when new value is less than previous one; Step S133 duty cycle estimation ending, if the sampled duty cycle value is bigger than the value store in the minimum register 613.

After comparison, channel selecting counter makes an increment and goes on to next channel counting if it is not the last channel of the MUX. If it is, the channel select register stores the optimal channel number of the MUX which generate the closest value with the reference duty cycle, and the system loops back for the next threshold level. Repeat the same procedure till all threshold levels are done.

Figure 13:
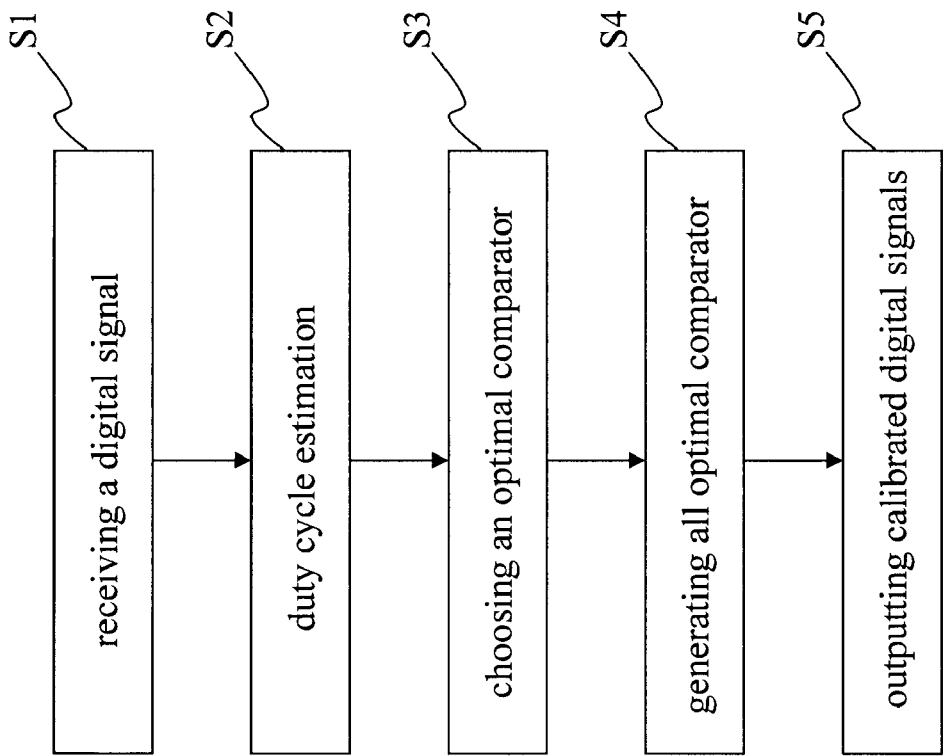
FIG. 13 is a calibration process flow according to one embodiment of the present invention.

In FIG. 13 shows the calibration process flow according to one embodiment of the present invention. Step S1 receiving a digital signal, a calibration circuit receives a digital signal from an ADC, which has several comparator arrays, and for each comparator array having a plurality of comparators; Step S2 duty cycle estimation, the calibration circuit samples the digital signal to obtain a duty cycle value by undersampling means; Step S3 choosing an optimal comparator, the calibration circuit obtains the comparators' duty cycle values in each comparator array, and compares the duty cycle value to an ideal duty cycle to obtain an optimal comparator in each comparator array; Step S4 generating all optimal comparator, the calibration circuit obtains the optimal comparators from the comparator arrays; and Step S5 outputting calibrated digital signals, the ADC outputs calibrated digital signals.

The present invention discloses an ADC with advantages of simple structure, high-speed, power-efficient, low hardware overhead, and high immunity against process variation and temperature. The present invention use the tri-state inverters as comparators and multiplexers for the merit of power saving and gain boosting. Because the threshold comparators are deeply impacted by process variation, The present invention use an undersampling scheme for calibration. By means of duty cycle estimation, the optimal comparators and channels can be chosen. The numbers of sampling are evaluated by statistical analysis. The calibration circuit makes it highly accurate, and less impacted by process variation.

According to the present invention, the conventional reference resistance row is eliminated, and instead, comparators are used, resulting in simplified circuitry, improved conversion speed, and facilitated VLSI formation.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A high-speed analog to digital converter comprising:
   a plurality of comparator arrays receiving an input signal, wherein each said comparator array outputs a plurality of analog signals, wherein each said comparator array comprises a plurality of comparators shunting together and said comparators have different threshold voltages, wherein each said comparator comprises a tri-state inverter with threshold voltage; and an inductive load unit coupled to said tri-state inverter to generate an inductive-load, said inductive load unit has an inverter and a transmission gate; and
   a plurality of channel-selecting MUXs correspondingly connecting to said comparator arrays and receiving said analog signals, wherein each said channel-selecting MUX outputs a digital signal and comprises a plurality of 2-1 multiplexers, so said comparator in each said comparator array have its own independent signal transmission channel.

2. The high-speed analog to digital converter according to claim 1, wherein said comparator arrays is arranged in parallel connection.

3. The high-speed analog to digital converter according to claim 1, wherein said input signal is an analog signal.

4. The high-speed analog to digital converter according to claim 1, wherein said digital signals are DC bias threshold voltage.

5. The high-speed analog to digital converter according to claim 1, wherein said tri-state inverter comprises:
   a first PMOS coupled to an input end with said first PMOS's gate;
   a first NMOS coupled to said input end with said first NMOS's gate;
   a second PMOS;
   a second NMOS coupled to an enable end with said second NMOS's gate; and
   an inverter coupled to said second PMOS's gate and said enable end;
   and said first PMOS, first NMOS, second PMOS and second NMOS shunt together and connect to an output end.

6. The high-speed analog to digital converter according to claim 1, wherein said signal transmission channel's voltage level partially overlaps the voltage level of adjacent signal transmission channel for small signal coverage, and a plurality of logic gates connect to the output of said comparator arrays.

7. A self-calibrating and high-speed analog to digital converter comprising:
   an analog to digital converter receiving an input signal, wherein said input signal is divided into a plurality of channels, said analog to digital converter comprising:
      a plurality of comparator arrays receiving said input signal, wherein each said comparator array outputs a digital signal; and
      a plurality of channel-selecting MUXs correspondingly connecting to said comparator arrays and receiving said digital signals, wherein each said channel-selecting MUX outputs a full pulse digital signal; and
   a calibration circuits coupled to said analog to digital converter, wherein said calibration circuits comprises:
      a duty cycle estimator coupled to said channel-selecting MUXs and sampling each said full pulse digital signal to generate a duty cycle value;
      a channel selecting circuit coupled to said duty cycle estimator and said channel-selecting MUXs and controlling one of said channel-selecting MUXs to match the threshold voltage to said duty cycle value, then continuing until the last said channel-selecting MUX's duty cycle value is produced;
      a level selecting circuit coupled to said duty cycle estimator and said channel selecting circuit and sequentially matching said duty cycle values for said comparator arrays, an optimal comparators selected from said comparator arrays; and
      a calibration controlling circuit coupled to said duty cycle estimator, said channel selecting circuit and said level selecting circuit to control the whole calibration processes.

8. The self-calibrating and high-speed analog to digital converter according to claim 7, wherein said comparator arrays are arranged in parallel connection.

9. The self-calibrating and high-speed analog to digital converter according to claim 7, wherein said input signal is an analog signal.

10. The self-calibrating and high-speed analog to digital converter according to claim 7, wherein said digital signals are DC bias threshold voltage.

11. The self-calibrating and high-speed analog to digital converter according to claim 7, wherein each said comparator array comprises a plurality of comparators shunting together.

12. The self-calibrating and high-speed analog to digital converter according to claim 11, wherein each said comparator comprises a tri-state inverter with threshold voltage; and an inductive load unit coupled to said tri-state inverter to generate an inductive-load, said inductive load unit has an inverter and a transmission gate.

13. The self-calibrating and high-speed analog to digital converter according to claim 7, wherein each said channel-selecting MUX comprises a plurality of 2-1 multiplexers, so said comparator in each said comparator array has its own independent signal transfer channel, wherein said signal transfer channel's voltage level partial overlaps the close signal transfer channel's for small signal coverage, and a plurality of logic gates connect to the output of said comparator array.

14. The self-calibrating and high-speed analog to digital converter according to claim 7, wherein said means to sample said full pulse digital signal is asynchronous under-sampling.

15. The self-calibrating and high-speed analog to digital converter according to claim 7, wherein the calibration circuits further includes a verifying interface for testing considerations including manual switches for manually selecting channels to test device characteristics and showing the channel.

16. A self-calibrating and high-speed analog to digital converter, comprising:
an analog to digital converter comprising:
a plurality of comparator arrays receiving an input signal, wherein said comparator arrays outputs a plurality of digital signals respectively; and
a plurality of channel-selecting MUXs correspondingly connecting to said comparator arrays and receiving said digital signals, wherein each said channel-selecting MUX outputs a full pulse digital signal; and
a calibration circuit coupled to said analog to digital converter, wherein said calibration circuit comprises:
a duty cycle estimation circuit coupled to said channel-selecting MUXs and sampling said full pulse digital signal to generate a duty cycle value;
a minimum register storing a minimum differential value between said duty cycle value and a reference duty cycle value;
an absolute offset operator coupled to said duty cycle estimation circuit and getting an absolute value by subtracting said duty cycle value from said reference duty cycle value;
a digital comparator coupled to said absolute offset operator and said minimum register, and comparing said absolute value to said minimum differential value, wherein said digital comparator stores the closest absolute value in said minimum register presenting the duty cycle of an appropriate comparator;
a plurality of channel selecting registers coupled to said channel-selecting MUXs and passing said digital signals through, wherein said channel selecting registers couple to said digital comparator and said minimum register to store said appropriate comparators in each said channel-selecting MUXs;
a channel selecting counter coupled to said channel selecting registers and said channel-selecting MUXs to select channels, and storing said channel selecting counter's value into said channel select registers when the value of said minimum register is renewed;
a level selecting counter coupled to said channel selecting registers and said channel selecting MUXs, wherein said level selecting counter selects said comparator arrays one by one; and
a calibration controlling circuit coupled to said duty cycle estimation circuit, said channel selecting counter and said level selecting counter to control the whole calibration processes.

17. The self-calibrating and high-speed analog to digital converter according to claim 16, wherein said comparator arrays are arranged in parallel connection.

18. The self-calibrating and high-speed analog to digital converter according to claim 16, wherein said input signal is an analog signal.

19. The self-calibrating and high-speed analog to digital converter according to claim 16, wherein said digital signals are DC voltage bias levels.

20. The self-calibrating and high-speed analog to digital converter according to claim 16, wherein each said comparator array comprises a plurality of comparators shunting together.

21. The self-calibrating and high-speed analog to digital converter according to claim 20, wherein each said comparator comprises a tri-state inverter with threshold voltage; and an inductive load unit coupled to said tri-state inverter to generate an inductive-load, said inductive load unit has an inverter and a transmission gate.

22. The self-calibrating and high-speed analog to digital converter according to claim 21, wherein said tri-state inverter comprises:
a first PMOS coupled to an input end with said first PMOS's gate;
a first NMOS coupled to said input end with said first NMOS's gate;
a second PMOS;
a second NMOS coupled to an enable end with said second NMOS's gate; and
an inverter coupled to said second PMOS's gate and said enable end;
and said first PMOS, first NMOS, second PMOS and second NMOS shunt together and connect to an output end.

23. The self-calibrating and high-speed analog to digital converter according to claim 16, wherein the means to sample said full pulse digital signal is asynchronous under-sampling.

24. The self-calibrating and high-speed analog to digital converter according to claim 16, wherein said calibration circuits further includes a verifying interface for testing, wherein said verifying interface having a manual switch for manually selecting channels to test said analog to digital converter and showing said channels.

25. A self-calibrating method for high-speed analog to digital converter, comprising:
receiving a plurality of digital signals from an analog to digital converter, wherein said analog to digital converter has a plurality of comparator arrays, and each said comparator array has a plurality of comparators;
sampling said digital signals to obtain a plurality of duty cycle values;
obtaining said duty cycle values in from said comparators, and comparing said duty cycle values to a reference duty cycle to obtain an optimal comparator in each said comparator array;
obtaining all said optimal comparators in said comparator arrays; and
outputting a plurality of calibrated digital signals through said optimal comparators.

26. The self-calibrating method for high-speed analog to digital converter according to claim 25, wherein said analog to digital converter includes a plurality of channel-selecting MUXs respectively connecting to said comparator arrays to receive said digital signals, each said channel-selecting MUXs outputs a digital signal.

27. The self-calibrating method for high-speed analog to digital converter according to claim 26, wherein each said channel-selecting MUX comprises a plurality of 2-1 multiplexers, so said comparator in each said comparator array has its own independent signal transfer channel, wherein said signal transfer channel's voltage level partial overlaps the close signal transfer channel's voltage level for small signal coverage, wherein a plurality of logic gates connect to the output of said comparator array.

28. The self-calibrating method for high-speed analog to digital converter according to claim 25, wherein said means to sample said full pulse digital signal is asynchronous under-sampling.

* * * * *